US008329584B2

(12) United States Patent
Takewaki et al.

(10) Patent No.: US 8,329,584 B2
(45) Date of Patent: Dec. 11, 2012

(54) METHOD OF MANUFACTURING SEMICONDUCTOR DEVICE

(75) Inventors: Toshiyuki Takewaki, Kanagawa (JP); Manabu Iguchi, Kanagawa (JP); Daisuke Oshida, Kanagawa (JP); Hironori Toyoshima, Kanagawa (JP); Masayuki Hiroi, Kanagawa (JP); Takuji Onuma, Kanagawa (JP); Hiroaki Nanba, Kanagawa (JP); Ichiro Honma, Kanagawa (JP); Mieko Hasegawa, Kanagawa (JP); Yasuaki Tsuchiya, Kanagawa (JP); Toshiji Taiji, Kanagawa (JP); Takaharu Kunugi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/151,867

(22) Filed: Jun. 2, 2011

(65) Prior Publication Data

US 2011/0230051 A1 Sep. 22, 2011

Related U.S. Application Data

(62) Division of application No. 12/543,128, filed on Aug. 18, 2009, now Pat. No. 7,955,980, which is a division of application No. 11/953,127, filed on Dec. 10, 2007, now Pat. No. 7,601,640.

(30) Foreign Application Priority Data

Dec. 8, 2006 (JP) ................................ 2006-331965

(51) Int. Cl.
*H01L 21/44* (2006.01)

(52) U.S. Cl. . 438/687; 438/690; 438/692; 257/E21.214; 257/E21.237

(58) Field of Classification Search .................. 438/687, 438/690, 692, 693; 257/E21.214, E21.237, 257/E21.586
See application file for complete search history.

(56) References Cited

U.S. PATENT DOCUMENTS

| | | | |
|---|---|---|---|
| 6,423,148 B1 | 7/2002 | Aoki | |
| 6,436,681 B1 | 8/2002 | Schroder et al. | |
| 6,520,819 B1 | 2/2003 | Sakaguchi | |
| 6,537,914 B1 * | 3/2003 | Park et al. | 438/692 |
| 6,821,897 B2 | 11/2004 | Schroeder et al. | |
| 6,897,150 B1 | 5/2005 | Aoki et al. | |
| 7,427,305 B2 | 9/2008 | Scott et al. | |
| 2002/0037642 A1 | 3/2002 | Wake et al. | |
| 2002/0106877 A1 * | 8/2002 | Hsu et al. | 438/586 |
| 2003/0109129 A1 * | 6/2003 | Saito et al. | 438/627 |
| 2003/0194859 A1 * | 10/2003 | Huang | 438/652 |
| 2005/0159005 A1 * | 7/2005 | Shirasu et al. | 438/692 |
| 2006/0141790 A1 | 6/2006 | Kim et al. | |

FOREIGN PATENT DOCUMENTS

JP 2000-91277 3/2000
(Continued)

OTHER PUBLICATIONS

Japanese Official Action—2007-316076—Jan. 24, 2012.
(Continued)

*Primary Examiner* — Phuc Dang
(74) *Attorney, Agent, or Firm* — Young & Thompson

(57) ABSTRACT

A post-CMP cleaning process of a copper layer is to be performed as follows. An alkaline aqueous solution, a polycarboxylic acid, BTA, and an alkaline aqueous solution are sequentially brought into contact with a primary surface of a silicon substrate over which the copper layer is provided.

14 Claims, 8 Drawing Sheets

FOREIGN PATENT DOCUMENTS

| | | |
|---|---|---|
| JP | 2001-148385 | 5/2001 |
| JP | 2002-110679 | 4/2002 |
| JP | 2002-305198 | 10/2002 |
| JP | 2006-310759 | 11/2006 |

OTHER PUBLICATIONS

"Volatile Corrosion Inhibitor (VCI)", Jul. 1; pp. 1-10, plus English language abstract, Three-Bond Technical News, No. 18., 1975.

* cited by examiner

METHOD OF MANUFACTURING SEMICONDUCTOR DEVICE

TECHNICAL FIELD

The present invention relates to a method of manufacturing a semiconductor device, and more particularly to a method of manufacturing a semiconductor device in which a copper-containing metal is employed as a material of an interconnect.

RELATED ART

Recently, copper has come to be popularly employed as a material for an interconnect, in response to the demand for higher integration level and faster operation speed of semiconductor devices. Copper has, in comparison with aluminum which has conventionally been employed, the advantage of lower resistance, as well as higher electromigration resistance.

The interconnect structure including copper is formed through what is known as a Damascene process, as described in Japanese Patent Laid-Open No.2002-110679, including performing a chemical mechanical polishing (hereinafter, CMP) process after forming a copper layer. In the Damascene process, the CMP process is generally followed by a cleaning process.

Japanese Patent Laid-Open No.2002-110679 points out that the cleaning process after the CMP incurs an increase in resistance of the interconnect. The literature also proposes, as a remedy therefor, that the semiconductor substrate that has undergone the CMP process be subjected to an alkali cleaning and an acid cleaning sequentially, and that the semiconductor substrate be subjected to a reduction process, either after the CMP and before the post-CMP cleaning or after the alkali cleaning and before the acid cleaning.

Among those cleaning processes, the acid cleaning is intended to improve time-dependent dielectric breakdown (hereinafter, TDDB) characteristic and remove a residual metal. Also, the literature states that the reduction process reduces the copper surface which has been once oxidized through the CMP process, to thereby enhance the resistance of the entire copper interconnect against the cleaning solution. This allows, according to the literature, suppressing formation of a step and etching corrosion on an upper portion of the copper interconnect, thereby suppressing the increase or fluctuation in resistance of the buried interconnect, which is predominantly composed of copper.

In addition, although in a different technical field, "Volatile Corrosion Inhibitor (VCI)", Three-Bond Technical News, 18, p.4, July 1, S62 states that benzotriazole (hereinafter, BTA), known as an anti-corrosion agent for copper, may form a different polymer compound depending on the ionic status of the copper.

Upon reviewing the Damascene process from the foregoing viewpoint, however, the present inventors have discovered that the method according to the Japanese Patent Laid-Open No.2002-110679 still have a room for improvement with respect to suppressing degradation in TDDB resistance, because the interconnect has come to be formed in narrower spacing these days. The imperfect suppressing effect of the TDDB resistance degradation was prominently observed through the BTA processing performed after the acid cleaning in the post-CMP cleaning process. The degradation in TDDB resistance leads to loss of reliability in the semiconductor device, and hence has to be suppressed.

SUMMARY

The present inventors have investigated the cause of the degradation in TDDB resistance through the conventional cleaning process, and have reached the following assumption.

In the conventional cleaning procedure, although studies were made on the process before the acid cleaning, the rinsing process after the acid cleaning has not been studied, and simply pure water has been employed for rinsing. However, since Cu is present in pure water in a form of ion, Cu in the interconnect metal may elute as ion, through the rinsing process.

Besides, when the BTA processing is performed under the presence of Cu ion, BTA molecules are linearly coordinated with the Cu ion, to thereby form a composite, as will be subsequently described referring to FIG. 7. Such composite will hereinafter be referred to as Cu-BTA composite I, where appropriate. The Cu-BTA composite I attaches to an insulating interlayer in a film form, after which it is difficult to remove the composite by cleaning with pure water. Thus, in the case where an upper layer interconnect formation process is performed with the Cu-BTA composite I attached to the region where the metal layers are provided at narrow intervals, the Cu ion remaining between the metal layers can serve as an electrical path to thereby incur a short circuit, or degrade the TDDB resistance.

Based on the foregoing assumption, therefore, the present inventors have deeply investigated on measures for inhibiting the Cu-BTA composite I from attaching to the insulating interlayer during the cleaning process. As a result, the present inventors have discovered that performing a reduced water processing after the acid cleaning and before BTA-derivative processing effectively decreases the substance that remains attached after the cleaning, thus achieving the present invention.

Although the foregoing description refers to the BTA processing as an example, the present inventors have discovered that, in the case of employing an organic substance that forms a composite with Cu ion, like BTA, in the cleaning process, the foregoing series of procedure effectively decreases the substance that remains attached after the cleaning.

In one aspect of the present invention, there is provided a method of manufacturing a semiconductor device, comprising:

forming a copper-containing metal layer over a semiconductor substrate;

polishing the copper-containing metal layer; and cleaning a surface of the copper-containing metal layer after polishing the copper-containing metal layer;

wherein the process of cleaning the surface of the copper-containing metal layer includes:

a first process including bringing a polycarboxylic acid into contact with a primary surface of the semiconductor substrate over which the copper-containing metal layer is provided;

a second process including bringing a reduced water into contact with the primary surface after the first process;

a third process including bringing benzotriazole or a derivative thereof with the primary surface after the second process; and a fourth process including bringing an alkaline aqueous solution into contact with the primary surface after the third process.

By the method thus arranged, the first process to the fourth process are sequentially performed in the cleaning process of the copper-containing metal layer. Such process securely protects the surface of the copper-containing metal layer when bringing the BTA or a derivative thereof into contact with that surface, and inhibits the copper from remaining over the semiconductor substrate. Consequently, the method improves the TDDB resistance, thereby facilitating stably manufacturing highly reliable semiconductor devices.

Presumably, the foregoing owes to the following reason.

According to the present invention, firstly, the second process of providing a reduced water to the surface of the copper-containing metal layer, after the first process of processing the surface of the copper-containing metal layer with a polycarboxylic acid and before the third process of processing with the BTA-derivative. Through such process, the Cu ion or Cu oxide remaining over the semiconductor substrate after the acid treatment is reduced thus to become Cu. At the same time the surface of the copper-containing metal layer is also reduced, and therefore elusion of the Cu ion can be suppressed.

Performing then the third process of processing the surface of the copper-containing metal layer with the BTA-derivative leads to formation of BTA-derivative coating over the surface of the copper-containing metal layer and of the Cu remaining over the semiconductor substrate, and resultantly the Cu and the BTA-derivative forms a composite. Such composite will hereinafter be referred to as Cu-BTA composite II, where appropriate. The coordination status of the BTA-derivative in the Cu-BTA composite II is assumed to be different from that in the Cu-BTA composite I.

According to the present invention, further, the third process of processing the surface of the copper-containing metal layer with the BTA-derivative is followed by the fourth process of providing the alkaline aqueous solution to the surface of the copper-containing metal layer. The fourth process lowers the affinity between the Cu-BTA composite II formed in the third process and the semiconductor device surface, thus facilitating effectively removing the Cu-BTA composite II from an upper level of the semiconductor substrate.

Thus, according to the present invention, sequentially performing the foregoing processes in the post-CMP cleaning process of the copper-containing metal layer suppresses the degradation in TDDB resistance of the semiconductor device, thereby improving the reliability of the same.

The term of "reduced water" herein means water that offers higher reducing effect than pure water, such as hydrogen water obtainable by dissolving hydrogen gas in pure water, or electrolyzed water obtainable through electrolysis of pure water. The oxidation/reduction potential of the reduced water may be below 0 mV for example, and more particularly may be specified as equal to or higher than $-1$ V and equal to or lower than $-500$ mV. The oxidation/reduction potential herein represents a value based on a silver/silver chloride electrode, and hence conversion to a value based on a standard hydrogen electrode can be made by adding a correction value (normally approx. +200 mV) corresponding to the assumed temperature. In addition, the hydrogen ion concentration of the reduced water may be equal to or higher than pH 6.5 and equal to or lower than pH 14.

In another aspect of the present invention, there is provided a method of manufacturing a semiconductor device, comprising:

forming a trench in an insulating layer over a semiconductor substrate;

forming a copper-containing metal layer over the insulating layer and inside the trench;

polishing the copper-containing metal layer so as to expose the insulating layer; and cleaning a surface of the copper-containing metal layer and of the insulating layer, after polishing the copper-containing metal layer;

wherein the process of cleaning the surface of the copper-containing metal layer and of the insulating layer includes:

a first process including removing copper ion and copper oxide;

a second process including reducing, after the first process, the copper ion and the copper oxide remaining unremoved through the first process, thereby giving copper;

a third process including enclosing with an organic layer, after the second process, the copper reduced through the second process;

a fourth process including giving a negative surface potential to the organic layer and to the insulating layer, after the third process.

By the method thus arranged, the first process to the fourth process are sequentially performed in the cleaning process of the copper-containing metal layer. Such process securely protects the surface of the copper-containing metal layer by enclosing the copper with the organic layer, and inhibits the copper from remaining over the semiconductor substrate. Consequently, the method improves the TDDB resistance, thereby facilitating stably manufacturing highly reliable semiconductor devices.

Thus, the present invention enables upgrading reliability of a semiconductor device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, an embodiment of the present invention will be described in details, referring to the accompanying drawings.

In all the drawings, same constituents are given the same numerals, and the description thereof will not be repeated.

Figure 1:
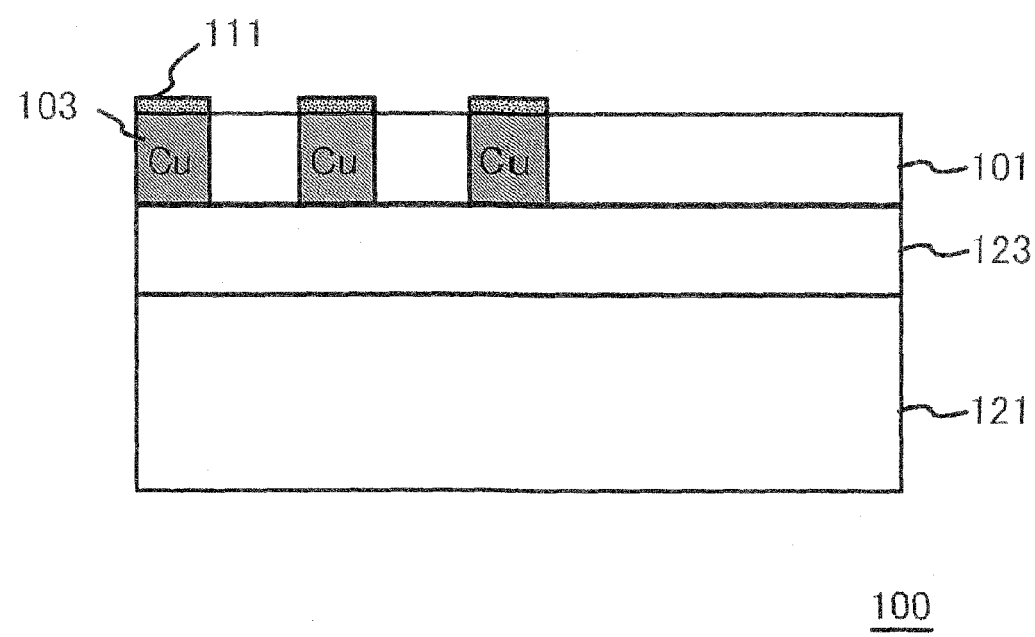
FIG. 1 is a cross-sectional view showing a structure of a semiconductor device according to an embodiment.

FIG. 1 is a cross-sectional view showing a structure of a semiconductor device according to the embodiment.

In the semiconductor device 100 shown in FIG. 1, a predetermined device such as a transistor (not shown) are provided on the primary surface of a silicon substrate 121. The semiconductor device 100 also includes an insulating interlayer 123 and an insulating interlayer 101, sequentially layered on the silicon substrate 121. An interconnect trench 125 (FIG. 2A) penetrating through the insulating interlayer 101 is filled with a Cu layer 103 that constitutes the interconnect. The upper surface of the Cu layer 103 is coated with the Cu-BTA composite II 111.

A method of manufacturing the semiconductor device 100 will now be described. The method of manufacturing includes the following process.

Step 11: Forming the insulating interlayer 101 over a semiconductor substrate (silicon substrate 121);

Step 12: Selectively removing a predetermined region of the insulating interlayer 101, to thereby form a concave (interconnect trench 125);

Step 13: Forming a copper-containing metal layer (Cu layer 103) over the silicon substrate 121, so as to fill in the interconnect trench 125, after the step 11 and step 12;

Step 14: Polishing the Cu layer 103; and

Step 15: Cleaning the surface of the Cu layer 103, after the step 14 of polishing the Cu layer 103.

Figure 2A:
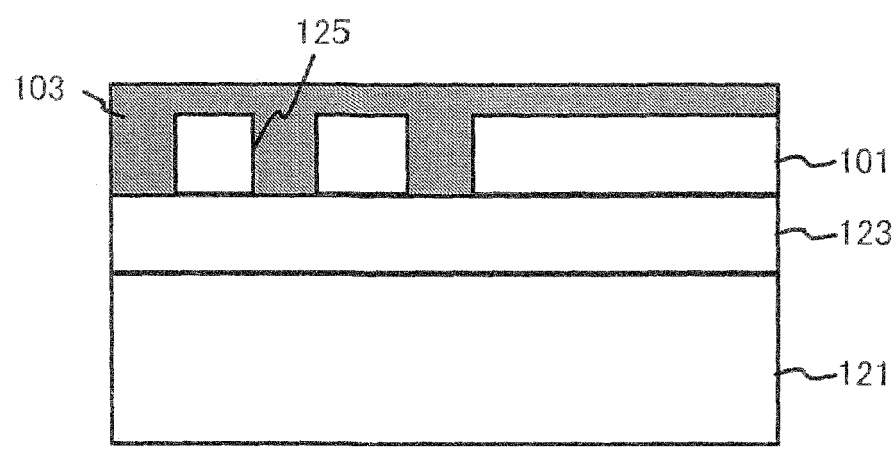
FIGS. 2A and 2B are cross-sectional views sequentially showing a manufacturing process of the semiconductor device shown in FIG. 1.
Figure 2B:
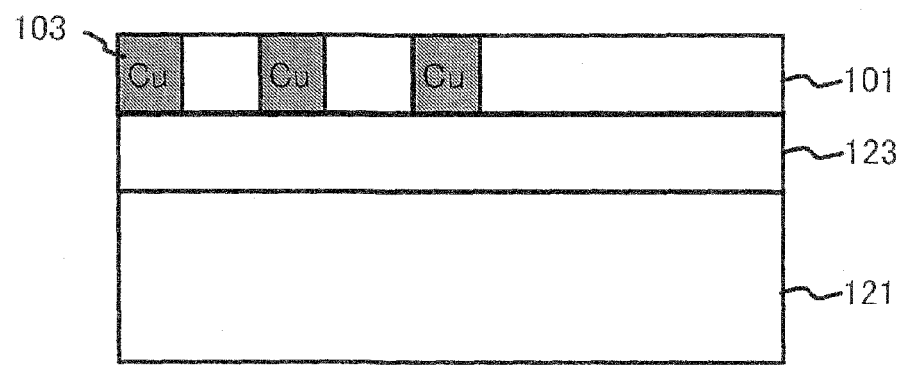

Referring to FIGS. 2A and 2B, further details will be described hereunder. FIGS. 2A and 2B are cross-sectional views sequentially showing a manufacturing process of the semiconductor device 100.

Referring first to FIG. 2A, the insulating interlayer 123 and the insulating interlayer 101 are sequentially formed, all over the primary surface of the silicon substrate 121 (step 11). The insulating interlayer 123 and the insulating interlayer 101 may be a single or a multilayer structure or stacked layers. For example, the insulating interlayer 101 may be constituted of an SiN layer which serves as an etching stopper and an $SiO_2$ layer, stacked in this order from the side of the substrate.

Then a known lithography and etching process are performed, so as to form a resist layer (not shown) patterned in a predetermined shape, on the insulating interlayer 101, and to selectively remove a predetermined region of the insulating interlayer 101 utilizing the resist layer as the mask, thus to form a concave (interconnect trench 125) (step 12).

Then the resist layer used for forming the interconnect trench 125 is removed and a barrier metal layer (not shown) is formed all over the insulating interlayer 101, after which the Cu layer 103 is formed so as to fill in the interconnect trench 125 (step 13). To be more detailed, the Cu layer 103 is formed on the insulating interlayer 101 and inside the interconnect trench 125.

Referring then to FIG. 2B, a CMP process is performed, for example utilizing an acid slurry, to thereby polish the Cu layer 103 (step 14). This step removes the Cu layer 103 and the barrier metal layer which are present outside the interconnect trench 125, thus exposing the surface of the insulating interlayer 101.

Then the surface of the insulating interlayer 101 and the Cu layer 103 are cleaned, to thereby remove a metal contaminant originating from the formation and the CMP process of the Cu layer 103 (step 15).

The step 15 includes the following steps.

Step 20: Bringing an alkaline aqueous solution into contact with the primary surface of the silicon substrate 121, over which the Cu layer 103 is provided;

Step 21 (first process): Bringing a polycarboxylic acid into contact with the primary surface of the silicon substrate 121, over which the Cu layer 103 is provided, after the step 20;

Step 22 (second process): Bringing a reduced water (an electrolyzed cathode water) into contact with the primary surface of the silicon substrate 121, over which the Cu layer 103 is provided, after the step 21;

Step 23 (third process): Bringing the BTA or a derivative thereof into contact with the primary surface of the silicon substrate 121, over which the Cu layer 103 is provided, after the step 22; and Step 24 (fourth process): Bringing an alkaline aqueous solution into contact with the primary surface of the silicon substrate 121, over which the Cu layer 103 is provided, after the step 23.

Referring to FIGS. 3A to 3E, the cleaning process will be described in further details. FIGS. 3A to 3E are cross-sectional views sequentially showing a manufacturing process of the semiconductor device 100. It is to be noted that in FIGS. 3A to 3E the layers below the insulating interlayer 101 are not shown.

In the cleaning process, firstly an alkaline aqueous solution is brought into contact with the surface of the insulating interlayer 101 and of the Cu layer 103. To be more detailed, an alkali reduced water, an example of the alkaline aqueous solution, is provided all over the surface of the insulating interlayer 101. The $SiO_2$ layer constituting the insulating interlayer 101, and particles (polishing particles) in the slurry employed in the CMP process both have a negative zeta potential, and hence cleaning with the alkaline aqueous solution leads to generating a reactive force between the $SiO_2$ layer and the particles, and thus removing the particles attached to the surface of the insulating interlayer 101 (step 20, FIG. 3A). The step 20 is a process of removing the slurry. It should be noted that at this stage $Cu_2O$ 105 may remain attached to the surface of the insulating interlayer 101, or $Cu^{2+}$ 107 may still be present in the liquid on the surface of the insulating interlayer 101.

Then the polycarboxylic acid is brought into contact with the surface of the insulating interlayer 101 and of the Cu layer 103. More specifically, the entire surface of the insulating interlayer 101, where the Cu layer 103 is exposed, is processed with the polycarboxylic acid (step 21, FIG. 3B). The step 21 corresponds to the process of removing copper ion and copper oxide. Here, it is preferable to employ such polycarboxylic acid that can chelate with copper, to further ensure the removal of the copper, and examples of such carboxyl acid include oxalic acid. In this case, Cu ion ($Cu^{2+}$ 107) and Cu oxide layer ($Cu_2O$ 105) on the insulating interlayer 101 are removed by the chelating effect of the oxalic acid.

Figure 3A:
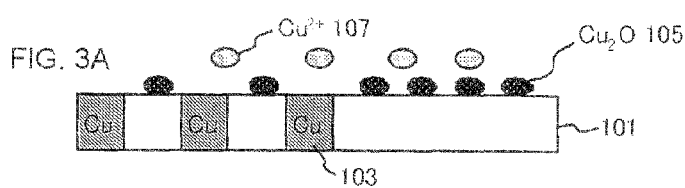
FIGS. 3A to 3E are cross-sectional views sequentially showing a manufacturing process of the semiconductor device shown in FIG. 1.
Figure 3B:
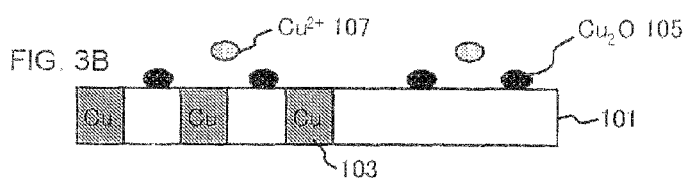
Figure 3C:
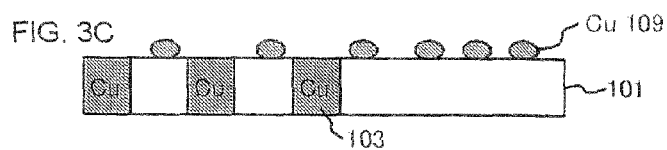
Figure 3D:
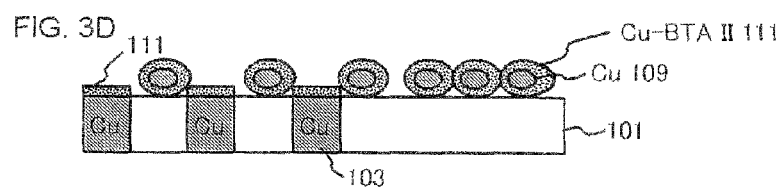
Figure 3D:
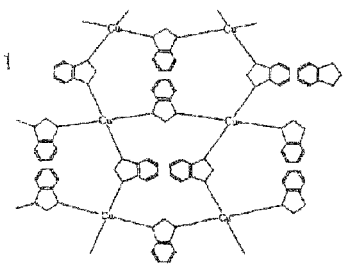
Figure 3E:
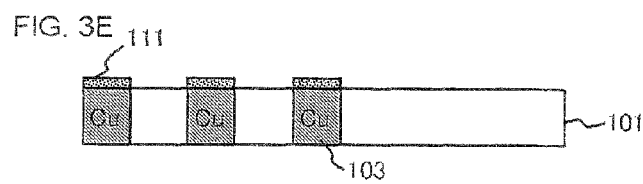

Through the investigation by the present inventors, however, it has been discovered that upon completion of the step 21 the $Cu_2O$ 105 and the $Cu^{2+}$ 107 are not yet thoroughly removed, as shown in FIG. 3B.

Accordingly, reduced water is then brought into contact with the surface of the insulating interlayer 101 and of the Cu layer 103. More specifically, an alkali reduced water is employed as an example of the reduced water, to be provided all over the surface of the insulating interlayer 101, where the Cu layer 103 is exposed, prior to the BTA processing. This process reduces the Cu in the $Cu_2O$ 105 and the $Cu^{2+}$ 107 still remaining after the step 21, thereby turning them into Cu particles (Cu 109) (step 22, FIG. 3C). At this stage, the Cu exposed on the surface of the Cu layer 103 is also reduced.

The step 22 corresponds to the process of reducing the copper ion and the copper oxide into copper. Here, although the purpose of the step 22 is to reduce the $Cu_2O$ 105 and the $Cu^{2+}$ 107, employing the alkaline reduced water is more preferable, since this also neutralizes the oxalic acid provided at the step 21.

After the reduction, benzotriazole or a derivative thereof is brought into contact with the surface of the insulating interlayer 101 and of the Cu layer 103. To be more detailed, the entire surface of the insulating interlayer 101, where the Cu layer 103 is exposed, is processed with BTA, which serves as a corrosion inhibitor (step 23, FIG. 3D). The step 23 corresponds to the process of enclosing with an organic layer the copper reduced in the preceding process (in this embodiment, BTA processing). In this case, the BTA may be prepared as an aqueous solution in a concentration of 3% or less. Also, adding a water-soluble compound containing no metal atom but at least one nitrogen atom in its molecule to the aqueous solution allows increasing the BTA concentration from 3%. Examples of such water-soluble compound include ammonium hydroxide, tetramethylammonium hydroxide, an amine compound and an amide compound. The copper in the Cu 109 and Cu layer 103 and the BTA form a composite so as to provide a coating over the Cu surface, thus constituting the Cu-BTA composite II 111.

The foregoing process allows effectively protecting the surface of the Cu layer 103 after the CMP process, thereby preventing oxidation of the surface of the Cu layer 103. Also, coating the Cu 109 with a BTA monolayer thus forming the Cu-BTA composite II 111 leads to a similar behavior to organic particles, from the viewpoint of zeta potential. Accordingly, the particles of the Cu-BTA composite II 111 can be completely removed from the upper surface of the insulating interlayer 101, in the step 24 to be subsequently described.

Then the alkaline aqueous solution is brought into contact with the surface of the insulating interlayer 101 and of the Cu layer 103. To be more detailed, an alkali reduced water is provided over the entire surface of the insulating interlayer 101, as an example of the alkaline aqueous solution (step 24, FIG. 3E). Providing the alkaline aqueous solution lowers the affinity between the Cu-BTA composite II 111 and the $SiO_2$ constituting the insulating interlayer 101, thereby removing the Cu-BTA composite II 111 on the $SiO_2$. The step 24 corresponds to the process of giving a negative surface potential (zeta potential) to the organic layer (in this embodiment, BTA monolayer) and to the insulating interlayer 101.

Throughout the foregoing process, the semiconductor device 100 shown in FIG. 1 can be obtained. In the foregoing process, an insulating interlayer may be additionally provided on the insulating interlayer 101 to thereby form a predetermined interconnect, after heating the semiconductor device 100 so as to remove the Cu-BTA composite II 111 on the Cu layer 103.

This embodiment offers the following advantageous effects.

Reducing the copper after the acid treatment and before the BTA treatment according to this embodiment enables suppressing the composite of the BTA and the copper (oxidized state) from remaining attached to the surface of the insulating interlayer 101 or of the Cu layer 103, even when a corrosion inhibitor that is combined with an oxidized substance and a reduced substance in different forms, such as BTA, is employed.

The foregoing point will be described in further details hereunder, in comparison with the conventional method.

FIGS. 7A to 7E are cross-sectional views sequentially showing a conventional cleaning process. FIGS. 7A to 7E depict the cleaning process performed after forming a Cu layer 203 in an interconnect trench formed in an insulating interlayer 201, and removing the Cu layer 203 outside the interconnect trench by a CMP process, to thereby expose the insulating interlayer 201.

Figure 7A:
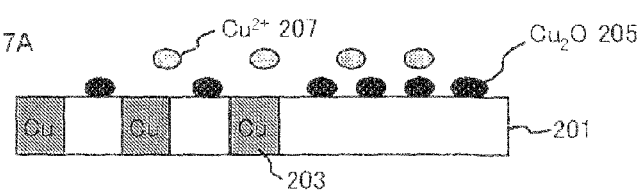
FIGS. 7A to 7E are cross-sectional views sequentially showing a manufacturing process of a semiconductor device.
Figure 7B:
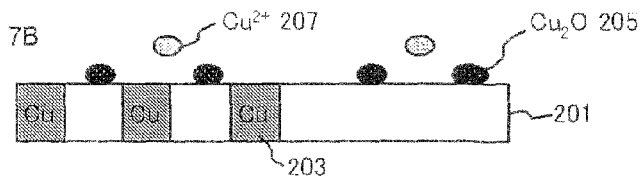

FIGS. 7A and 7B correspond to FIGS. 3A and 3B respectively. In this case also, firstly the alkali reduced water is provided all over the surface of the insulating interlayer 201 (FIG. 7A), after which oxalic acid is provided for cleaning (FIG. 7B).

Figure 7C:
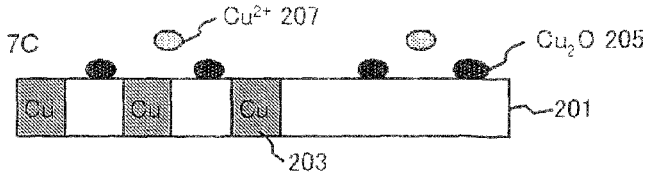

Then pure water is provided all over the surface of the insulating interlayer 201, where the Cu layer 203 is exposed (FIG. 7C). At the moment that the pure water processing is completed, $Cu_2O$ 205 and $Cu^{2+}$ 207 are not yet reduced and the copper is still present in the ion state on the insulating interlayer 201, unlike the state after providing the alkali reduced water described referring to FIG. 3C. Also, Cu ion eludes from the Cu layer 203.

Figure 7D:
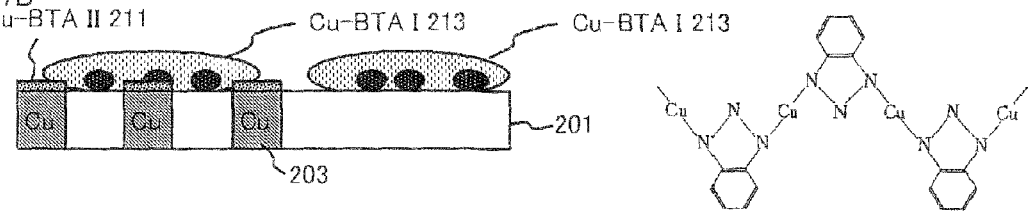

The entire surface of the insulating interlayer 201 is then processed with a BTA aqueous solution (FIG. 7D). At this stage, the BTA and Cu ion form a composite, thus to become the Cu-BTA composite I 213. The Cu-BTA composite I 213 is the linear compound shown in FIG. 7D, and attaches to the surface of the insulating interlayer 201 and of the Cu layer 203 in a film form. Accordingly, in a region where the interconnect is provided at narrow intervals, the Cu-BTA composite I 213 is often formed over a plurality of Cu layers 203.

Figure 7E:
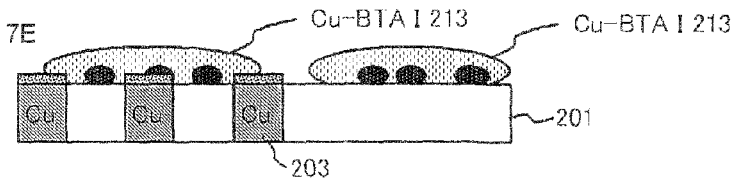

Finally, pure water is provided all over the surface of the insulating interlayer 201 (FIG. 7E). At this stage, a portion of the Cu-BTA composite I 213 formed through the BTA processing may remain unremoved by the pure water cleaning. Such situation provokes current leakage between the interconnects constituted of the Cu layer 203, and degradation in TDDB resistance.

In contrast, according to this embodiment the Cu ion is reduced after the oxalic acid cleaning and before the BTA processing, to thereby form the Cu-BTA composite II 111 through the BTA processing. Then the BTA processing is followed by the alkaline aqueous solution processing, for removal of the Cu-BTA composite II 111. Such arrangement ensures that the Cu ion remaining at the end of the step 21 is thoroughly removed, thereby facilitating effectively suppressing a short circuit and degradation in TDDB resistance, even in the region where the interconnect is densely provided.

Thus, according to this embodiment, bringing a polycarboxylic acid (for example, oxalic acid), a reduced water, the BTA or a derivative thereof, and an alkaline aqueous solution into contact in this order with the surface of the insulating interlayer and of the Cu layer, in the cleaning process after the CMP process for the copper-containing metal layer, enables upgrading the reliability of the semiconductor device.

Also, in this embodiment the reduced water provided in the step 22 and the alkaline aqueous solution provided in the step 24 are of the same type. More specifically, the alkali reduced water is employed in both of those steps. Such arrangement simplifies the configuration of the cleaning apparatus.

Further, in this embodiment the alkali reduced water is employed as the alkaline aqueous solution to be provided in the step 20 and the step 24. Such arrangement further simplifies the configuration of the cleaning apparatus, including the case of performing the step 20 for removing the slurry prior to the step 21.

The embodiment of the present invention has been described referring to the drawings, it is to be understood that the embodiment is merely exemplary, and that various other arrangements may be adopted.

To cite a few examples, although the foregoing embodiment represents a case of forming an interconnect, the method according to the embodiment may be applied to a formation process of a via plug connecting between interconnect layers. Also, the foregoing embodiment is applicable to an entirety of the Damascene process, and may be applied to either a single Damascene process or a dual Damascene process.

Also, although the acid slurry is employed in the CMP process according to the foregoing embodiment, the type of the slurry is not specifically limited. Employing the acid slurry is, however, more preferable because the alkaline aqueous solution provided in the step 20 can neutralize the slurry.

Further, although the embodiment represents a case of employing the alkali reduced water as the alkaline aqueous solution to be provided in the step 20, for example ammonia water may be employed, other than the alkali reduced water.

Likewise, with respect to the alkaline aqueous solution employed in the step 24 also, for example ammonia water may be employed without limitation to the alkali reduced water. In addition, for assuring the separation of the Cu-BTA composite II 111 from the Cu layer 103, the alkaline aqueous solution employed in the step 24 may be adjusted to be a weak alkali, of 8 to 9 in pH value.

Also, although oxalic acid is employed in the step 21 in the embodiment, otherwise citric acid or the like may be employed, as the polycarboxylic acid capable of chelating with copper.

Further, although the alkali reduced water is employed in the step 22 in the embodiment, any solution may be employed in the step 22 before the BTA processing, as long as the solution is capable of reducing the Cu ion remaining on the insulating interlayer 101.

Still further, such oxidation/reduction potential that makes Cu inactive according to potential-pH diagram may be adopted in the step 22. Such arrangement further assures that the copper is inhibited from oxidation. In this case, the pH value of the alkali reduced water employed in the step 22 may be adjusted to be equal to or higher than 7.4 and equal to or lower than 9.5.

WORKING EXAMPLES

Working Example 1

To make up a first working sample, an $SiO_2$ layer was formed on a silicon wafer, as the insulating interlayer. An interconnect trench corresponding to an interconnect pattern was formed in the $SiO_2$ layer, and the interconnect trench was filled with a Cu layer, after which a CMP process was performed with an acid slurry, to thereby remove by polishing the Cu layer present outside the interconnect trench and to expose the $SiO_2$ layer, and then cleaning was performed under different cleaning conditions as specified below.

In the cleaning process, electrolyzed water was provided for 40 seconds to the surface where the $SiO_2$ layer is provided and oxalic acid of 0.1 wt % in concentration was provided for 20 seconds, in common to all the specimens. The subsequent process was performed as follows.

Figure 4A:
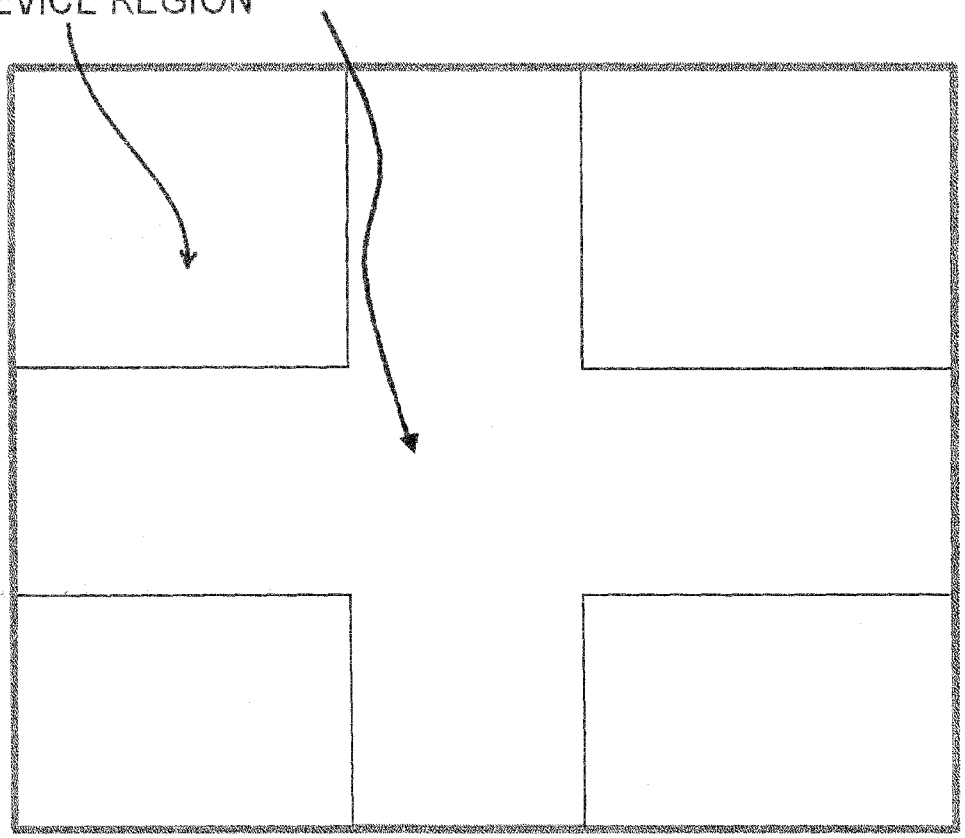
FIGS. 4A and 4B are a schematic plan view and a cross-sectional view respectively, showing a structure of a semiconductor device according to a working example.
Figure 4B:
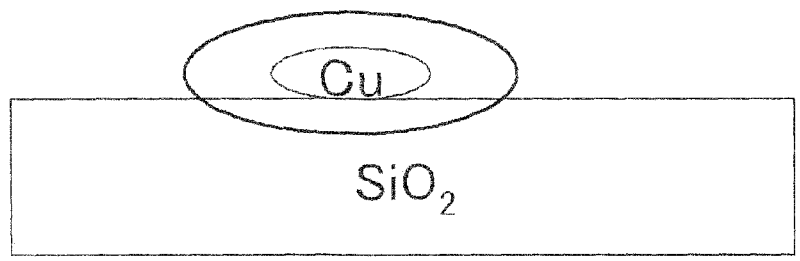
Figure 5:
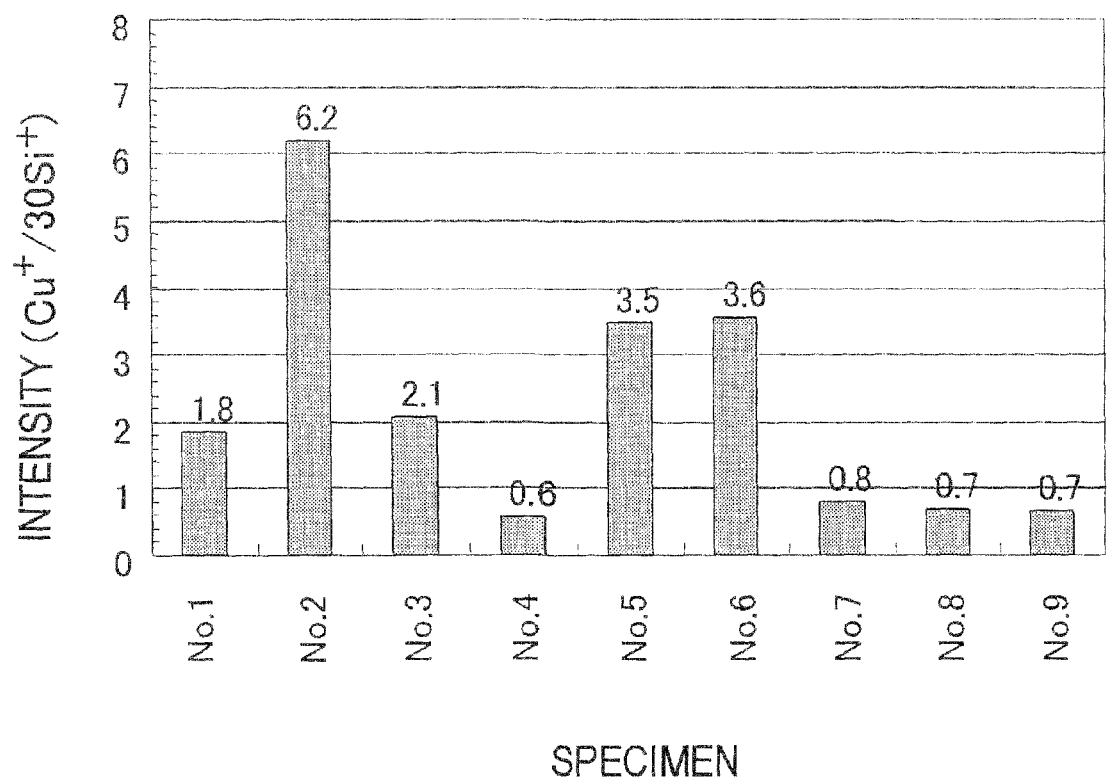
FIG. 5 is a bar graph showing a measurement result of Cu ion on an $SiO_2$ layer surface of the semiconductor device according to the working example.

Specimen 1: Provided pure water for 11.5 seconds→BTA processing→providing pure water for 10 seconds Specimen 2: Provided pure water for 11.5 seconds→Without BTA processing→without rinsing Specimen 3: Provided pure water for 11.5 seconds→BTA processing→providing eletrolyzed water for 10 seconds Specimen 4: Provided electrolyzed water for 11.5 seconds→BTA processing→providing electrolyzed water for 10 seconds Specimen 5: Provided electrolyzed water for 11.5 seconds→without BTA processing→without rinsing Specimen 6: Provided electrolyzed water for 20 seconds→without BTA processing→without rinsing Specimen 7: Provided electrolyzed water for 11.5 seconds→BTA processing→providing electrolyzed water for 20 seconds Specimen 8: Provided electrolyzed water for 11.5 seconds→BTA processing→providing electrolyzed water for 30 seconds Specimen 9: Provided electrolyzed water for 20 seconds→BTA processing→providing electrolyzed water for 10 seconds The residual Cu on the $SiO_2$ corresponding to a scribe region shown in FIGS. 4A and 4B was measured by TOF-SIMS method, with respect to the specimens 1 to 9. The result is shown in FIG. 5. In FIG. 5, "intensity" of the vertical axis represents the number of Cu atoms, and the numerals of the horizontal axis correspond to the respective numbers of the foregoing specimens. Also, "$Cu^+/30Si^+$" in FIG. 5 represents counts of bonds of the Cu atom and Si atom, with respect to the Cu on the $SiO_2$.

Also, the electrolyzed water employed for cleaning was alkali reduced water of 9.0 in pH value and −500 mV in oxidation/reduction potential, for all the specimens.

In view of FIG. 5, it is understood that performing the BTA processing after the oxalic acid cleaning lowers the Cu concentration. Also, providing the electrolyzed water after the oxalic acid treatment and before the BTA treatment, and additionally providing the electrolyzed water after the BTA treatment enables significantly decreasing the residual Cu concentration on the $SiO_2$ scribe region.

Working Example 2

As a second working example, the TDDB resistance between the Cu interconnects was evaluated, with respect to the specimen 1 and the specimen 4 from the working example 1. To be more detailed, under a high temperature and with such a voltage that the insulating layer can just manage to withstand being constantly applied, the time before the breakdown was measured. The width of the Cu interconnect was set at 0.1 μm, and the spacing between the interconnects was also set at 0.1 μm. The respective specimens were heated after the cleaning up to 330° C. so as to volatilize the BTA, after which SiCN and $SiO_2$ were sequentially deposited and pads were formed, for executing the evaluation of the specimens. Also, for depositing the SiCN, $NH_3$ plasma processing was performed for 10 seconds. The TDDB evaluation results thus obtained are shown in FIGS. 6 and 8.

Figure 6:
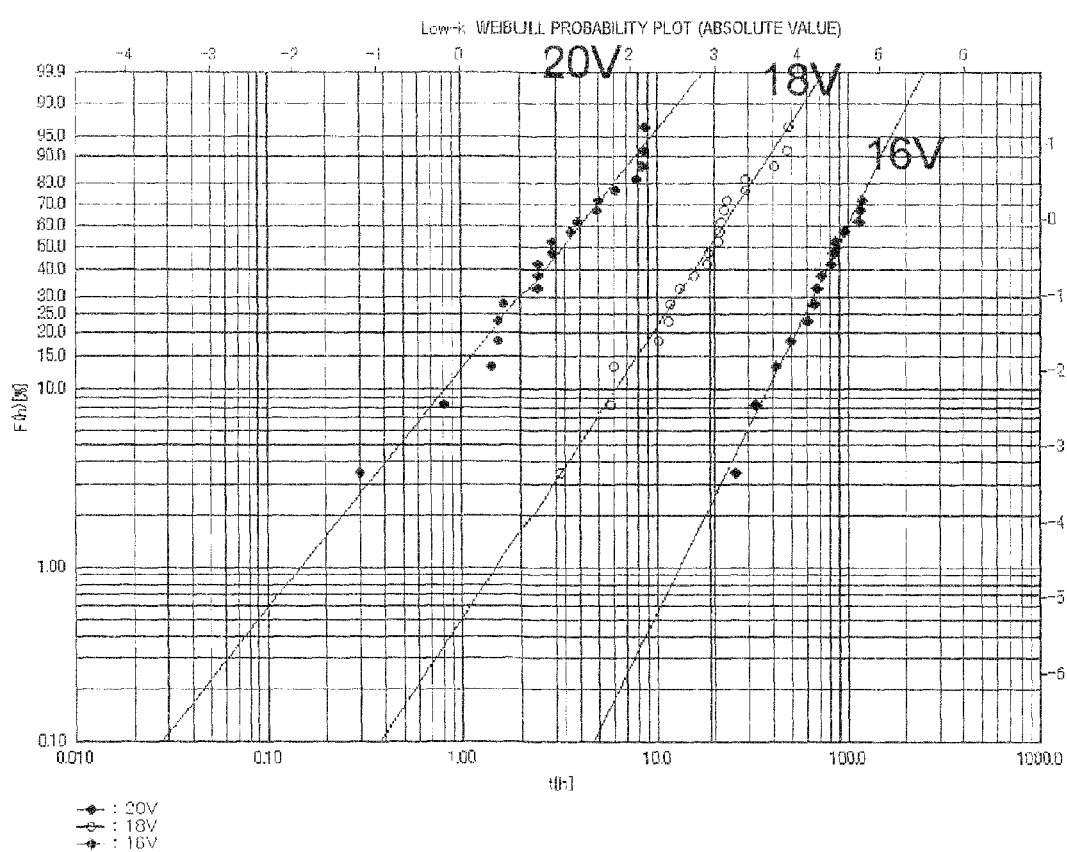
FIG. 6 is a diagram showing Weibull plots of the semiconductor device according to the working example.
Figure 8:
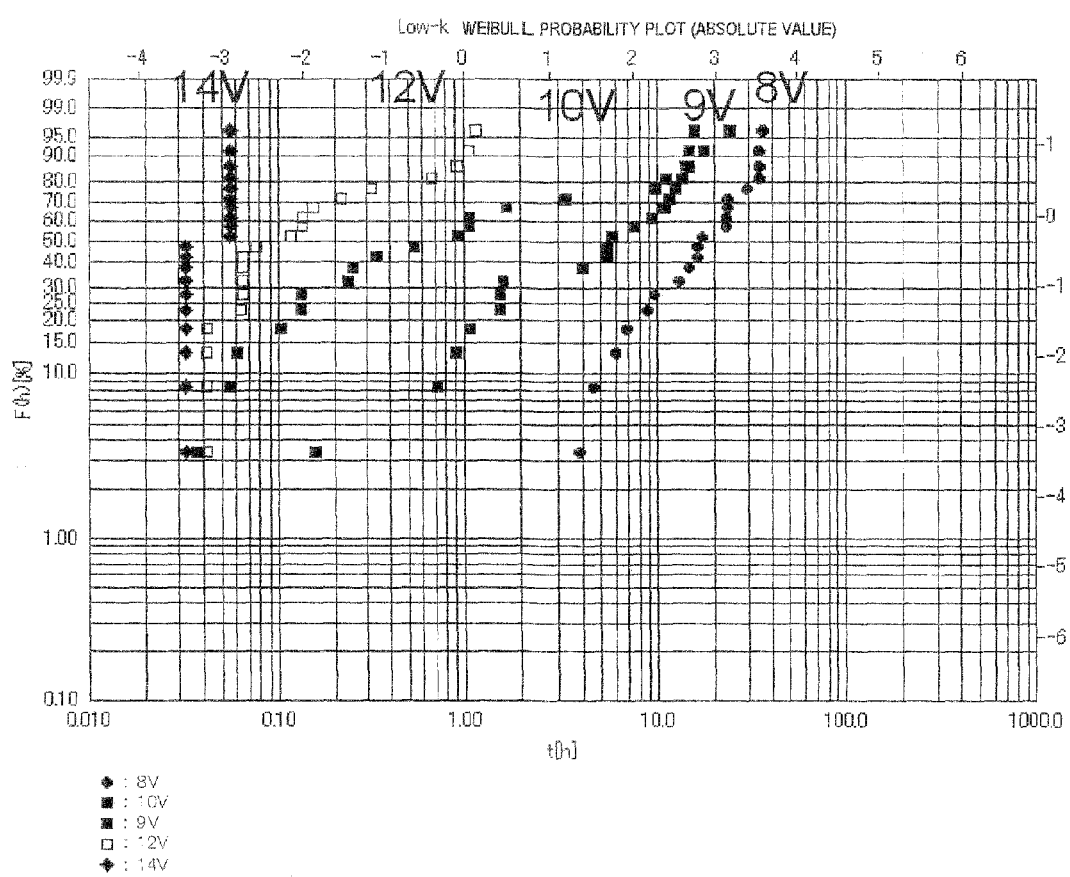
FIG. 8 is a diagram showing Weibull plots of the semiconductor device according to the working example.

FIG. 6 shows Weibull plots indicating the evaluation result of the specimen 4, and FIG. 8 shows Weibull plots indicating the evaluation result of the specimen 1. The voltage values in FIGS. 6 and 8 are the breakdown voltage between the Cu interconnects. In view of FIGS. 6 and 8, it is understood that providing the electrolyzed water after the oxalic acid cleaning and before the BTA processing, and additionally providing the electrolyzed water after the BTA processing leads to upgraded TDDB resistance of the insulating interlayer (between the Cu interconnects).

It is apparent that the present invention is not limited to the above embodiment, and may be modified and changed without departing from the scope and spirit of the invention.

What is claimed is:
1. A method of manufacturing a semiconductor device, comprising:
preparing a wafer comprising a semiconductor substrate, an insulating layer over the semiconductor substrate, the insulating layer having a trench formed therein, and a copper-containing metal layer filled inside said trench; and cleaning a surface of said copper-containing metal layer and of said insulating layer;

wherein said cleaning said surface of said copper-containing metal layer and of said insulating layer includes:

a first process including removing copper ion and copper oxide;

a second process including reducing, after said first process, said copper ion and said copper oxide remaining unremoved through said first process, thereby giving copper;

a third process including enclosing with an organic layer, after said second process, said copper given through said second process; and a fourth process including giving a negative surface potential to said organic layer and to said insulating layer, after said third process.

2. The method according to claim 1, wherein said cleaning the surface of said copper-containing metal layer and of said insulating layer further includes removing a slurry.

3. The method according to claim 1,
wherein said first process includes bringing polycarboxylic acid into contact with the surface of said copper-containing metal layer and of said insulating layer;
the second process includes bringing reduced water into contact with the surface of said copper-containing metal layer and of said insulating layer;
the third process includes bringing benzotriazole or a derivative thereof into contact with the surface of said copper-containing metal layer and of said insulating layer; and
the fourth process includes bringing an alkaline aqueous solution into contact with the surface of said copper-containing metal layer and of said insulating layer.

4. The method according to claim 2,
wherein said first process includes bringing a polycarboxylic acid into contact with the surface of said copper-containing metal layer and of said insulating layer;
the second process includes bringing a reduced water into contact with the surface of said copper-containing metal layer and of said insulating layer;
the third process includes bringing benzotriazole or a derivative thereof into contact with the surface of said copper-containing metal layer and of said insulating layer;
the fourth process includes bringing an alkaline aqueous solution into contact with the surface of said copper-containing metal layer and of said insulating layer; and
said removing the slurry includes bringing an alkaline aqueous solution into contact with the surface of said copper-containing metal layer and of said insulating layer.

5. The method according to claim 3, wherein said second process includes employing an alkali reduced water as said reduced water.

6. The method according to claim 5, wherein said alkali reduced water has a pH value equal to or higher than 7.4 and equal to or lower than 9.5.

7. The method according to claim 4,
wherein said second process includes employing an alkali reduced water as said reduced water; and
said fourth process and said removing the slurry include employing an alkali reduced water as said alkaline aqueous solution.

8. A method of manufacturing a semiconductor device, comprising:
preparing a wafer comprising a semiconductor substrate, an insulating layer over the semiconductor substrate, the insulating layer having a trench formed therein, and a copper-containing metal layer filled inside said trench; and
cleaning a surface of said copper-containing metal layer and of said insulating layer,
wherein said cleaning said surface of said copper-containing metal layer and of said insulating layer includes
a first process including reducing copper ion and copper oxide remaining on said surface of said copper-containing metal layer and of said insulating layer, thereby giving copper,
a second process including enclosing with an organic layer, after said first process, said copper given through said first process, and
a third process including giving a negative surface potential to said organic layer and to said insulating layer, after said second process.

9. The method according to claim 8, wherein said cleaning the surface of said copper-containing metal layer and of said insulating layer further includes removing a slurry.

10. The method according to claim 8, wherein,
the first process includes bringing reduced water into contact with the surface of said copper-containing metal layer and of said insulating layer,
the second process includes bringing benzotriazole or a derivative thereof into contact with the surface of said copper-containing metal layer and of said insulating layer, and
the third process includes bringing an alkaline aqueous solution into contact with the surface of said copper-containing metal layer and of said insulating layer.

11. The method according to claim 9, wherein,
the first process includes bringing a reduced water into contact with the surface of said copper-containing metal layer and of said insulating layer,
the second process includes bringing benzotriazole or a derivative thereof into contact with the surface of said copper-containing metal layer and of said insulating layer,
the third process includes bringing an alkaline aqueous solution into contact with the surface of said copper-containing metal layer and of said insulating layer, and
said removing the slurry includes bringing an alkaline aqueous solution into contact with the surface of said copper-containing metal layer and of said insulating layer.

12. The method according to claim 10, wherein said first process includes employing an alkali reduced water as said reduced water.

13. The method according to claim 12, wherein said alkali reduced water has a pH value equal to or higher than 7.4 and equal to or lower than 9.5.

14. The method according to claim 11, wherein,
said first process includes employing an alkali reduced water as said reduced water, and
said third process and said removing the slurry include employing an alkali reduced water as said alkaline aqueous solution.

* * * * *